(12) United States Patent
Tabrizi

(10) Patent No.: US 7,192,810 B2
(45) Date of Patent: Mar. 20, 2007

(54) SEMICONDUCTOR PACKAGING

(75) Inventor: Behnam Tabrizi, Marlborough, MA (US)

(73) Assignee: Skyworks Solutions, Inc., Irvine, CA (US)

(*) Notice: Subject to any disclaimer, the term of this patent is extended or adjusted under 35 U.S.C. 154(b) by 128 days.

(21) Appl. No.: 11/033,669

(22) Filed: Jan. 12, 2005

(65) Prior Publication Data
US 2005/0124232 A1 Jun. 9, 2005

Related U.S. Application Data

(62) Division of application No. 09/677,291, filed on Oct. 2, 2000, now Pat. No. 6,867,499.

(60) Provisional application No. 60/156,739, filed on Sep. 30, 1999.

(51) Int. Cl.
*H01L 21/50* (2006.01)
*H01L 21/48* (2006.01)
*H01L 21/44* (2006.01)
*H01L 29/00* (2006.01)

(52) U.S. Cl. .................. 438/125; 438/126; 438/106; 257/502

(58) Field of Classification Search ............... 438/106, 438/110, 125–126; 257/502, 668
See application file for complete search history.

(56) References Cited

U.S. PATENT DOCUMENTS 3,436,604 A   4/1969   Luecke et al. .............. 317/101
4,649,415 A   3/1987   Hebert ....................... 257/668

(Continued)

FOREIGN PATENT DOCUMENTS

JP   58197857   11/1983

(Continued)

OTHER PUBLICATIONS

Francis, et al., "Stackable 3-D Chip-Scale Package Uses Silicon as the Substrate," *Chip Scale Review*, vol. 1, No. 1, p. 79, May 1997.

(Continued)

*Primary Examiner*—Luan Thai
(74) *Attorney, Agent, or Firm*—Bromberg & Sunstein LLP

(57) ABSTRACT

An electronic component and a method for making an electronic component are disclosed. The electronic component has a silicon package. The silicon package has a recess formed thereon in which a conductive region is placed. A bare die electronic device is disposed in the recess. The device has a top, a bottom, sides and a plurality of terminals, including a non-top terminal. The non-top terminal is electrically coupled to the conductive region. The electronic component is constructed by first creating a recess in a silicon wafer to a depth substantially equal to the first dimension of the bare die electronic device. A conductive material is applied to the recess. The electronic device is inserted into the recess so that the bottom terminal is coupled to the conductive material. A dielectric or other planarizing material is applied into the recess. Top and bottom contacts are then applied to form the electronic component so that it may be used as a ball grid array package. The top contact is electrically coupled to the top terminal of the electronic device and the bottom contact is coupled electrically to the conductive material.

17 Claims, 5 Drawing Sheets

U.S. PATENT DOCUMENTS

| | | | |
|---|---|---|---|
| 4,745,455 A | 5/1988 | Glascock et al. | 357/74 |
| 4,766,479 A | 8/1988 | Krum et al. | 257/737 |
| 4,936,808 A | 6/1990 | Lee | 445/24 |
| 4,989,117 A | 1/1991 | Hernandez | 361/306.2 |
| 5,008,213 A | 4/1991 | Kolesar, Jr. | 438/107 |
| 5,034,044 A | 7/1991 | Glascock | 65/42 |
| 5,049,978 A * | 9/1991 | Bates et al. | 257/686 |
| 5,095,402 A | 3/1992 | Hernandez et al. | 361/306.2 |
| 5,133,795 A | 7/1992 | Glascock | 65/42 |
| 5,198,963 A | 3/1993 | Gupta et al. | 361/386 |
| 5,296,736 A | 3/1994 | Frei et al. | 257/668 |
| 5,397,747 A | 3/1995 | Angiulli et al. | 438/109 |
| 5,424,573 A | 6/1995 | Kato et al. | 257/431 |
| 5,559,363 A * | 9/1996 | Immorlica, Jr. | 257/664 |
| 5,610,442 A | 3/1997 | Schneider et al. | 257/787 |
| 5,629,835 A | 5/1997 | Mahulikar et al. | 361/719 |
| 5,633,533 A | 5/1997 | Andros et al. | 257/707 |
| 5,786,230 A | 7/1998 | Anderson et al. | 438/108 |
| 5,798,283 A | 8/1998 | Montague et al. | 438/24 |
| 5,801,073 A | 9/1998 | Robbins et al. | 438/125 |
| 5,828,126 A | 10/1998 | Thomas | 257/95 |
| 5,863,812 A | 1/1999 | Manteghi | 438/108 |
| 5,877,478 A | 3/1999 | Ando | 257/777 |
| 5,907,151 A * | 5/1999 | Gramann et al. | 250/214.1 |
| 5,907,769 A | 5/1999 | Corisis | 438/123 |
| 5,977,633 A | 11/1999 | Suzuki et al. | 257/738 |
| 5,986,885 A | 11/1999 | Wyland | 361/704 |
| 5,994,648 A | 11/1999 | Glovatsky et al. | 174/260 |
| 6,013,948 A | 1/2000 | Akram | 257/698 |
| 6,239,980 B1 | 5/2001 | Fillion et al. | 361/760 |
| 6,249,041 B1 | 6/2001 | Kasem et al. | 257/666 |
| 6,340,842 B1 * | 1/2002 | Nakamura | 257/724 |
| 6,867,499 B1 | 3/2005 | Tabrizi | 257/777 |

FOREIGN PATENT DOCUMENTS

| | | |
|---|---|---|
| JP | 59145537 | 8/1984 |
| JP | 05275580 | 10/1993 |
| WO | WO 96/12298 | 4/1996 |
| WO | WO 99/28971 | 6/1999 |

OTHER PUBLICATIONS

Savastiouk, et al., "3-D Stacked Wafer-Level Packaging," *Advanced Packaging Magazine*, Cover Story, Mar. 2000.

*EPO International Search Report*; PCT/US 00/27206; Oct. 2, 2000.

* cited by examiner

SEMICONDUCTOR PACKAGING

PRIORITY

This application claims priority from and is a divisional patent application of U.S. patent application Ser. No. 09/677,291 that was filed on Oct. 2, 2000, now U.S. Pat. No. 6,867,499 entitled "Semiconductor Packaging" that itself claims priority from U.S. provisional patent application Ser. No. 60/156,739, filed Sep. 30, 1999, entitled "Semiconductor Packaging", the disclosure of which is incorporated herein by reference.

TECHNICAL FIELD

The present invention relates to electronic devices and more particularly to packaging for electronic devices.

BACKGROUND ART

Semiconductor electronic devices often include a package surrounding the device to permit handling and electrical connections while providing protection for the electronic device from external environmental influences. Packages are typically manufactured out of plastic, metal, ceramic or glass.

SUMMARY OF THE INVENTION

In accordance with one aspect of the invention, an electronic component and a method for making an electronic component are disclosed. The electronic component has a silicon package. The silicon package has a recess formed thereon in which a conductive region is placed. A bare die electronic device is disposed in the recess. The device has a top, a bottom, sides and a plurality of terminals, including a non-top terminal. The non-top terminal is electrically coupled to the conductive region. The electronic component is constructed by first creating a recess in a silicon wafer to a depth substantially equal to the first dimension of the bare die electronic device. A conductive material is applied to the recess. The electronic device is inserted into the recess so that the bottom terminal is coupled to the conductive material. A dielectric or other planarizing material is applied into the recess. Top and bottom contacts are then applied to form the electronic component so that it may be used as a ball grid array (BGA) package. The top contact is electrically coupled to the top terminal of the electronic device and the bottom contact is coupled electrically to the conductive material.

In another embodiment, multiple recesses are created on a single silicon wafer and electronic devices are each inserted into one of the multiple recesses. The silicon wafer may then be cut to form multiple electronic components. Prior to the step of cutting, each of the electronic components may be tested.

In another embodiment where the electronic component is a chip device, one of the terminals of the device is a top contact located on the top of the device and the package has a top in which the recess is located. The top of the package also includes a contact coupled electrically via the conductive region to the non-top terminal.

BRIEF DESCRIPTION OF THE DRAWINGS

The foregoing features of the invention will be more readily understood by reference to the following detailed description taken with the accompanying drawings in which.

DETAILED DESCRIPTION OF SPECIFIC EMBODIMENTS

Figure 1:
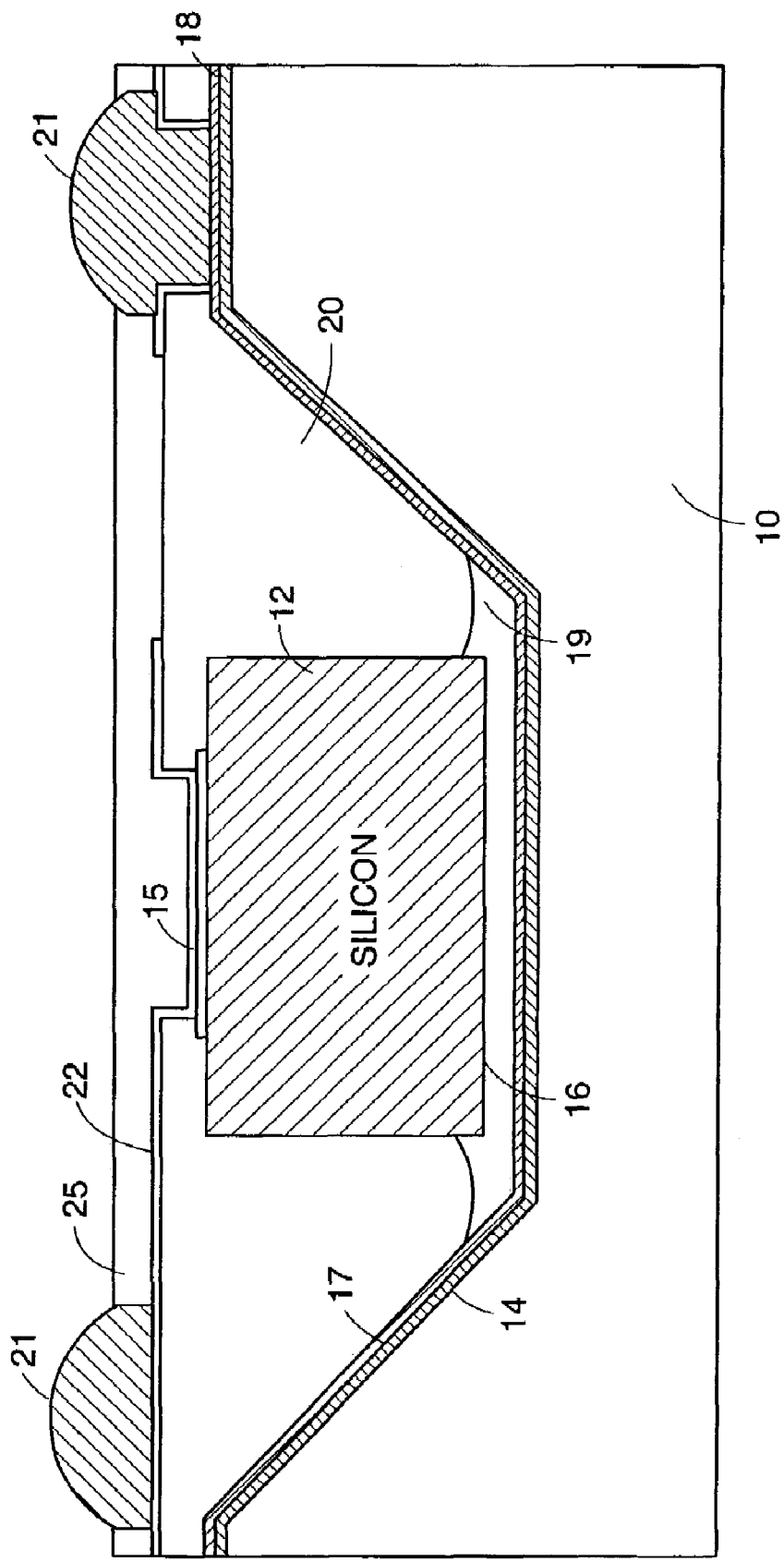
FIG. 1 is a side view of one embodiment of the invention in which an electronic device resides within a silicon package.

FIG. 1 is a side view of an electronic component. The electronic component is formed by a silicon package 10 from a silicon wafer surrounding an electronic device 12, preferably a bare die semiconductor device. The silicon package 10 includes a recess 14 in which the electronic device 12 resides. The electronic device 12 in the embodiment shown is a two-terminal device, although other multi-terminal devices, including both vertical and planar devices, may be used. The electronic device shown is a vertical device having a top terminal 15 and a bottom terminal 16. In the recess of the package, a conductive region 17 exists. The conductive region 17 covers all or a portion of the recess 14 and extends to a portion of the top 18 of the silicon package 10. The bottom terminal 16 of the two-terminal electronic device is electrically coupled to the conductive region 17. In preferred embodiments the conductive region is formed from metals such as titanium, copper and chrome. The bottom terminal 16 of the electronic device is secured to the conductive region by a conductive epoxy or solder 19. The recess 14 is filled with dielectric material 20 that surrounds the electronic device 12. If the dielectric layer 20 covers the top terminal 15 of the electronic device 12, the dielectric 20 that resides above the top terminal 15 is removed through photolithography. Dielectric may also be removed at a point where a solder contact for the bottom terminal is desired. A metalization layer 22 is applied over the dielectric after the top terminal 15 of the electronic device 12 is exposed. The metalization is deposited and patterned by standard methods to the desired routing including solder contact areas. In the shown embodiment, another layer of dielectric 25 resides on top of the metalization layer 22 fully encasing the electronic device 12 and only leaving the contacts exposed. It should be understood by those of ordinary skill in the art that for certain electronic devices a second layer of dielectric may not be needed. The solder contacts 21 are then created and preferably reside in the same plane so that the completed electronic component may be easily flip mounted onto a circuit board. In the preferred embodiment, the electronic device is a diode. However, it should be understood to one of ordinary skill in the art that other semiconductor devices, integrated circuits, or other electronic devices may be placed within the silicon package. This process produces a Wafer Level Chip-Scale Package (WLCSP) using silicon as the package.

The solder contacts for the terminals of the electronic device reside on the same side of the package allowing for surface mount assembly operation similar to a Ball Grid Array (BGA) package. It should be understood by those skilled in the art that other package materials may be used for creating a WLCSP instead of silicon. These other package materials must be sufficiently rigid to prevent breakage or exposure of the bare die. Further, the package material should be capable of being metalized, and should be capable of having a portion of the material removed so as to create a cavity or a recess.

Figure 2:
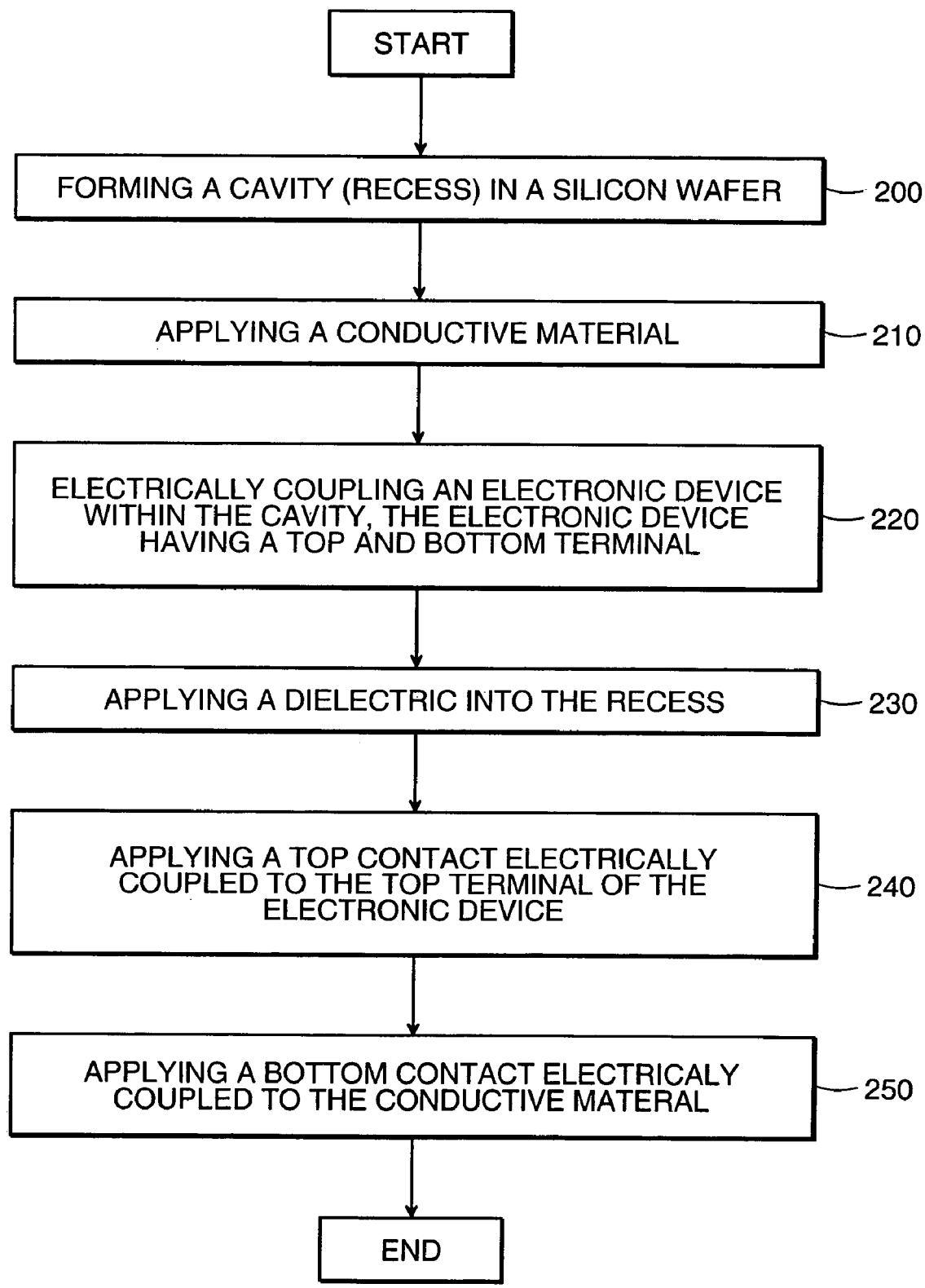
FIG. 2 is a flow chart of the steps used in creating a silicon package that is a Ball Grid Array (BGA) and that is also a Wafer Level Chip-Scale Package (WLCSP).
Figure 3:
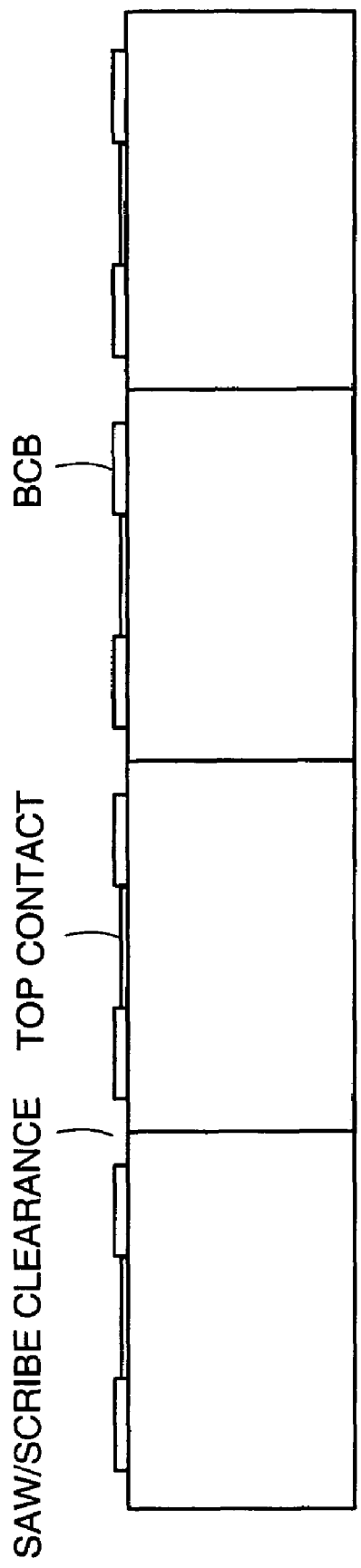
FIG. 3 is a side view of a silicon wafer having multiple electronic devices.

In FIG. 2 is shown a flowchart of the steps for packaging a bare die electronic device creating an electronic component. The method as described uses a standard silicon wafer to create one or more packages. The silicon wafer may be processed with most of the same tooling as used for wafer level device creation. In the preferred embodiment a silicon package creates a WLCSP. A recess is formed in a silicon wafer by either etching or sawing a trench in the wafer (200). The etching process could be dry etching or chemical wet etching which is known to those skilled in the art. The chemical etching step is normally performed by using $Si_3N_4$ as mask on the top surface of the silicon wafer. The mask is patterned to the desired cavity size(s) and location(s). The cavity etch is an anisotropical etch using a solution of KOH and treta-methyl ammonium hydroxide. The cavities created by this process will typically have sloped side walls of about 54 degrees. The recess is created so that an electronic device may reside within the recess. The depth of the recess is approximately the thickness of the electronic device. To the recess is applied at least one layers of conductive material (210). In case of devices with small contacts (approximately 0.003 inches in diameter or less), it is preferred that a layer of a dielectric such as bisbenzocyclobutene (BCB) is deposited on top of the electronic device covering the entire top surface except for contact terminals and saw/scribe borders seperation for device clearance (FIG. 3). In the preferred embodiment, the conductive material is applied in three layers. The first layer is titanium followed by a layer of copper and a layer of chrome, which cover the contour of the recess and at least a portion of the top of the silicon wafer. A layer of electrically conductive epoxy or solder is placed in the recess to assure that the device is mechanically secured and the electric device is electrically coupled to the conductive material for devices with non-top terminals. The electronic device is placed within the recess of the silicon wafer so that the bottom of the electronic device comes into contact with the conductive material within the recess (220). Silver epoxy is then cured or the solder is reflown, attaching the device to the bottom of the recess. Next, a layer of dielectric, such as BCB, is placed into the recess (230). Enough dielectric is added to fill the recess so that the recess is approximately planarized. The cavity fill process is done by covering a preheated silicon wafer (to reduce the viscosity of the BCB) and driving the BCB dielectric into the cavities and removing the excess material using a roller and blade drawn across the wafer. If needed another layer of dielectric can be spun on to achieve the desired planarization. The dielectric layer completely covers the electronic device, but it is desirable to keep the top terminal of the electronic device exposed. Dielectric must be subsequently removed from the top terminal and also an area on the top surface of the silicon wafer adjacent to the recess allowing direct exposure to the conductive material. One method of achieving this is by masking and removing the dry-etch BCB from the top terminal of the electronic device and desired area on the top surface of the silicon wafer. In an alternative method, a sufficient amount of the dielectric material is removed to expose the entire top surface of the silicon wafer and the top terminal of the electric device. Next, a layer of photo definable BCB is deposited and defined exposing the desired contact areas. A patterned metalization layer is applied to the top of the dielectric and the exposed surface. A last layer of dielectric is added for further insulation so that the only exposed conductive elements are the contacts for the top and bottom terminals. Solder is then deposited onto the exposed conductive elements, forming solder contacts in the appropriate positions such that an electronic coupling occurs between the solder contact and the top (240) and bottom terminals (250) of the device. This process does not require wire/tab bonding nor does it need a flip-chip to create this wafer level BGA CSP.

Figure 4:
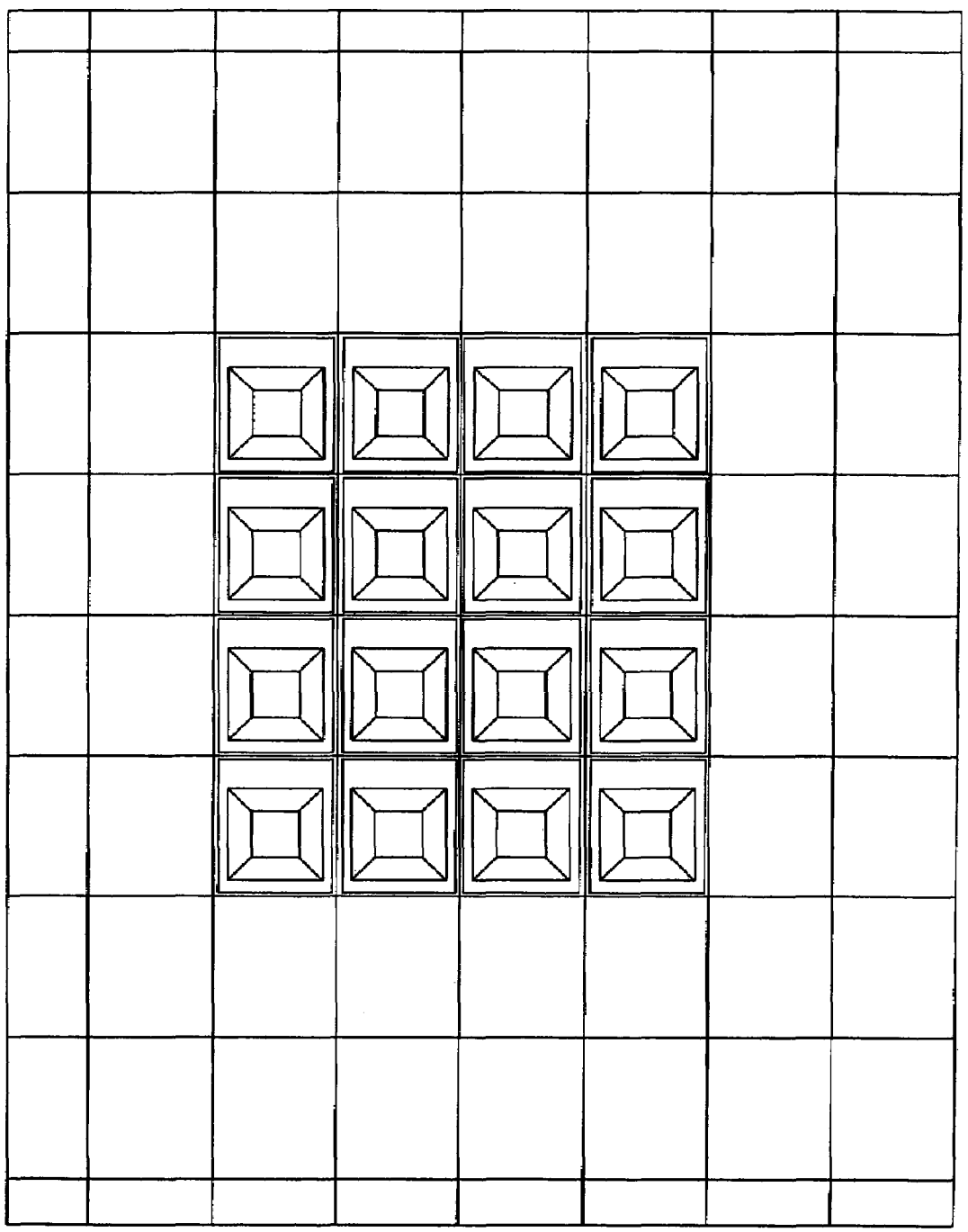
FIG. 4 shows a top view of a silicon wafer that has multiple cavities that are etched into the silicon, each cavity for receiving an electronic device to form multiple packages.

The method may be implemented on a silicon wafer of adequate depth for holding an electronic device. Multiple cavities may be formed for creating multiple packages on the same silicon wafer as shown in FIG. 4. The silicon wafer may be etched to create cavities or sawn to create trenches that are spaced to allow for the silicon wafer to be cut so that individual packaged electronic components may be produced. In FIG. 4 a 4×4 array of cavities is shown on a silicon wafer. Wafer probing of the electronic components may be accomplished prior to the sawing process for separating the completed electronic components.

In an alternative embodiment, multiple-die electronic components may be packaged by using the above-described technique. A silicon wafer having multiple cavities is formed where the cavities have different dimensions to accommodate different bare die electronic devices. The various bare die electronic devices are placed into their respectively dimensioned cavities and processed as before to create individual Chip-CSP's wherein each chip has metalized contacts. By creating contacts for each device, an additional layer of metalization may be applied which electrically couples the multiple electronic devices. A further layer of dielectric may be applied and solder contacts placed in appropriate positions. Separation of the completed multiple-die electronic components may occur by sawing the package. By creating additional cavities in a silicon wafer, multiple multiple-die electronic components may be created from a single silicon wafer.

Figure 5:
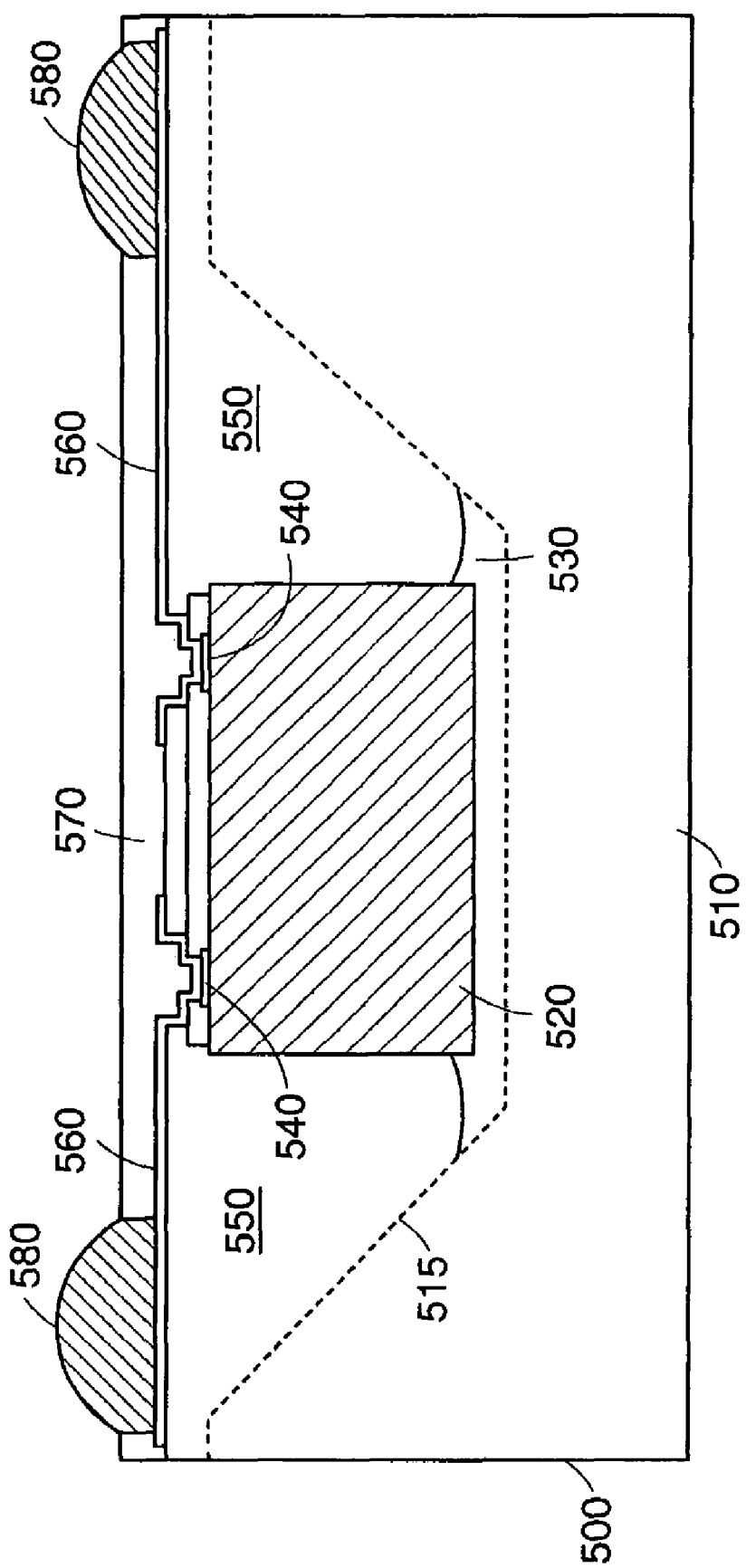
FIG. 5 is a side view of a planar electronic device positioned within a package with the terminals of the electronic device redistributed.

In FIG. 5 is shown a package 510 for a bare die planar electronic device 520 that has all terminals 540 on one side of the chip. In this embodiment, the terminals 540 of the device 520 are repositioned using the technique above. The bare die 520 is placed into a recess 515 of the package 510 and is adhered to the package using an adhesive 530 to mechanically couple the bare die 520 and the package 510. Into the portion of the recess 515 that is not filled by the bare die is placed a planarizing dielectric material 550. The planarizing material 550 creates an essentially planar surface for applying a layer of metalization 560 so that the terminals 540 of the bare die 520 may be repositioned. Once the terminals 540 are repositioned, a second layer of dielectric 570 is applied keeping only the positions of the final contacts exposed. At the desired position of the final contact a metal contact 580 or soldering bump is added. The electronic component 500 is electrically exposed only at the repositioned contact points 580 with the rest of the electronic device 520 shielded from electrical coupling by the package 510 or dielectric 570. In such a fashion, planar electronic devices having terminals that are positioned too close together and are at such a small scale that the terminals cannot maintain their electrical independence when placed on a circuit board may be made effectively larger by repositioning the contacts on the top of the package. Similarly, the terminals can be repositioned in any configuration that is more convenient for the end user of the electronic components. Thus, utilizing wafer-level processing, a smaller device may be made to be compatible with the dimensional requirements of a circuit board for fabrication of a more complicated product or subassembly.

In another embodiment, non-silicon based semiconductor bare die electronic devices, for example Gallium Arsenide electronic devices, may be made into Chip-CSPs by applying the process described above placing.

In another embodiment, passive elements such as resistors, capacitors, and inductors may be added on a redistribution layer or on the additional dielectric layers to provide a higher-level integrated electronic component.

The present invention may be embodied in other specific forms without departing from the true scope of the invention. The described embodiments are to be considered in all respects only as illustrative and not restrictive.

What is claimed is:

1. A method of packaging an electronic device to create an electronic component, the electronic device having a top terminal and a bottom terminal, a first dimension being defined by the distance between the top terminal and the bottom terminal, the method comprising:
   creating a recess in a silicon wafer, the recess having a depth substantially equal to the first dimension of the electronic device;
   applying a conductive material to the recess;
   inserting the electronic device into the recess so that the bottom terminal is coupled to the conductive material;
   applying a dielectric into the recess;
   applying a second conductive material on the dielectric;
   applying a top contact electrically coupled to the top terminal of the electronic device by the second conductive material; and
   applying a bottom contact electrically coupled to the conductive material.

2. The method according to claim 1, wherein:
   the silicon wafer has a top and a bottom, the recess being created on a portion of the top, and wherein the bottom contact is located on the top of the silicon wafer to enable surface mounting.

3. The method according to claim 2, wherein multiple recesses are created on a single silicon wafer and electronic devices are each inserted into one of the multiple recesses.

4. The method according to claim 3, wherein at least one of the electronic devices is a resistor, diode, capacitor, or inductor.

5. The method according to claim 3, the method further comprising:
   cutting the silicon wafer to form multiple electronic components.

6. The method according to claim 5, further comprising:
   prior to the step of cutting, testing each of the electronic components.

7. The method according to claim 1, wherein: the electronic component is a ball grid array packaged component.

8. A method of packaging an electronic device to create an electronic component according to claim 1, wherein: the silicon wafer has a top and a bottom, the recess being created on a portion of the top, and wherein the bottom contact is located on the top of the silicon wafer to enable surface mounting.

9. A method of packaging an electronic device to create an electronic component according to claim 1, further comprising:
   creating at least a second recess on the silicon wafer;
   mechanically coupling a second electronic device having one or more top terminals in the second recess;
   filling a portion of the second recess not occupied by the second electronic device with a planarizing material to substantially create a level plane;
   applying a top contact electrically coupled to the at least one top terminal of the second electronic device by a conductive material.

10. A method of packaging an electronic device to create an electronic component according to claim 9, the method further comprising:
    cutting the silicon wafer to form multiple electronic components.

11. A method of packaging an electronic device to create an electronic component according to claim 10, further comprising:
    prior to the step of cutting, testing each of the electronic components.

12. A method of packaging an electronic device to create an electronic component according to claim 1, further comprising:
    creating at least a second recess on the silicon wafer;
    placing a conductive material in the second recess;
    placing at least one additional electronic device into the second recess so that the bottom terminal is coupled to the conductive material;
    applying a dielectric into the recess;
    applying a second conductive material on the dielectric;
    applying a top contact electrically coupled to the top terminal of the electronic device by the second conductive material; and
    applying a bottom contact electrically coupled to the conductive material.

13. A method of packaging an electronic device to create an electronic component according to claim 12, the method further comprising:
    cutting the silicon wafer to form multiple electronic components.

14. A method of packaging an electronic device to create an electronic component according to claim 13, further comprising:
    prior to the step of cutting, testing each of the electronic components.

15. A method of packaging an electronic device to create an electronic component, the electronic device having a top surface and a plurality of terminals located at the top surface, the method comprising:
    providing a package having a recess;
    disposing the device within the recess;
    mechanically coupling the device to a surface of the recess;
    filling a portion of the recess not occupied by the device with a planarizing material to substantially create a level plane;
    removing a portion of the planarizing material above each of the plurality of terminals
    creating a plurality of redistribution points on the planarizing material; and
    placing a metal layer on the planarizing material electrically coupling each of the plurality of terminals and at least one redistribution point.

16. The method according to claim 15, further comprising:
    adding an insulating material on the metal layer covering the metal layer while leaving exposed the at least one redistribution point.

17. A method of packaging an electronic device to create an electronic component according to claim 15, wherein: the electronic component is a ball grid array packaged component.

* * * * *